(12) United States Patent
Stan et al.

(10) Patent No.: US 6,518,796 B1
(45) Date of Patent: Feb. 11, 2003

(54) DYNAMIC CMOS CIRCUITS WITH INDIVIDUALLY ADJUSTABLE NOISE IMMUNITY

(75) Inventors: Mircea R. Stan, Charlottesville, VA (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/607,495

(22) Filed: Jun. 30, 2000

(51) Int. Cl.[7] .............................................. H03K 19/096
(52) U.S. Cl. ........................... 326/121; 326/95; 326/96; 326/28
(58) Field of Search ................................ 326/26–28, 93, 326/95, 98, 112, 119, 121

(56) References Cited

U.S. PATENT DOCUMENTS 5,532,622 A * 7/1996 Beiley et al. ............... 326/121
5,841,300 A * 11/1998 Murabayashi et al. ........ 326/98
6,060,909 A * 5/2000 Aipperspach et al. ....... 326/121

* cited by examiner

Primary Examiner—Don Le
(74) Attorney, Agent, or Firm—Schwegman, Lundberg, Woessner & Kluth P.A.

(57) ABSTRACT

A system of individually adjusting noise immunity of each input of a dynamic circuit including parallel or series-parallel pull-down network comprises identifying precharge nodes of the dynamic circuit requiring a reduction of noise. Then further identifying NMOS transistor drains connected to the respective precharge nodes, then creating a pull-up network of PMOS transistors for the precharge nodes, respectively. After creating a pull-up network of PMOS transistors, the system further includes arranging the order of the PMOS transistors corresponding to the respective precharge nodes to improve the noise immunity and performance of the dynamic circuit. After completing the arranging of the order of the PMOS transistors, the system can further include sizing the PMOS transistors to achieve the required reduction of noise for the precharge nodes, respectively.

20 Claims, 7 Drawing Sheets

DYNAMIC CMOS CIRCUITS WITH INDIVIDUALLY ADJUSTABLE NOISE IMMUNITY

TECHNICAL FIELD

This invention relates generally to dynamic circuits, and more particularly to noise immunity of the dynamic circuits.

BACKGROUND

Dynamic logic circuits are well-known in the semiconductor data processing art. Basically, dynamic circuits require a two-phase operation. In a first phase, an output of the dynamic circuit is precharged and in a second phase, the output of the dynamic circuit is evaluated. While such dynamic circuits provide quick operation with lower power consumption than their static counterparts, dynamic circuits are particularly susceptible to noise on an input signal. Such noise can include ground bounce, crosstalk, charge sharing, process variations, charge leakage, alpha particles, electromagnetic radiation or other such unwanted electrical signals which occur within the circuit, resulting in spurious signals occurring at an output of the dynamic circuit. With dynamic circuits, in particular, such noise on an input may cause a precharged node therein to discharge and an erroneous output will be provided when the noise raises above the threshold voltage of the transistors comprising the dynamic circuit.

As power supply voltages ($V_{cc}$) are scaled down, the transistor threshold voltages ($V_{th}$) also needs to be reduced in order to preserve circuit performance. Generally the trade-off for low-voltage circuits is between noise margins and performance. Also generally the noise margin of dynamic circuits is directly related to $V_{th}$, and a reduction in threshold values results in a reduction in noise margin, and this reduction in noise margin may not be acceptable. Present solutions to the noise problems in dynamic circuits fall generally into two classes, the first being increasing noise margins of all inputs in the same way, and the second being independently controlling noise margins of each individual input. Increasing the noise margin of all inputs can result in reduced performance when only some of the inputs are noisy. Whereas independently controlling the noise margins of each input is generally a good trade-off for low voltage circuits in terms of performance, the present techniques of independently controlling the noise margins of each input is generally applicable to only special type of circuits such as AND gates (dynamic circuits including series pull-down network).

For the reasons stated above, and for other reasons stated below which will become apparent to those skilled in the art upon reading and understanding the present specification, there is a need in the data processing art for independently controlling the noise margins of each input in a dynamic circuit configuration including parallel or series-parallel pull-down network (such as OR and ANDOR gates) which has improved noise immunity that is not dependent on the type of circuitry (such as AND, OR, and ANDOR gates), and can generally work on all types of dynamic circuits.

DETAILED DESCRIPTION

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

This document describes, among other things, a system of individually adjusting a noise immunity of each of the inputs of a dynamic circuit.

Figure 1A:
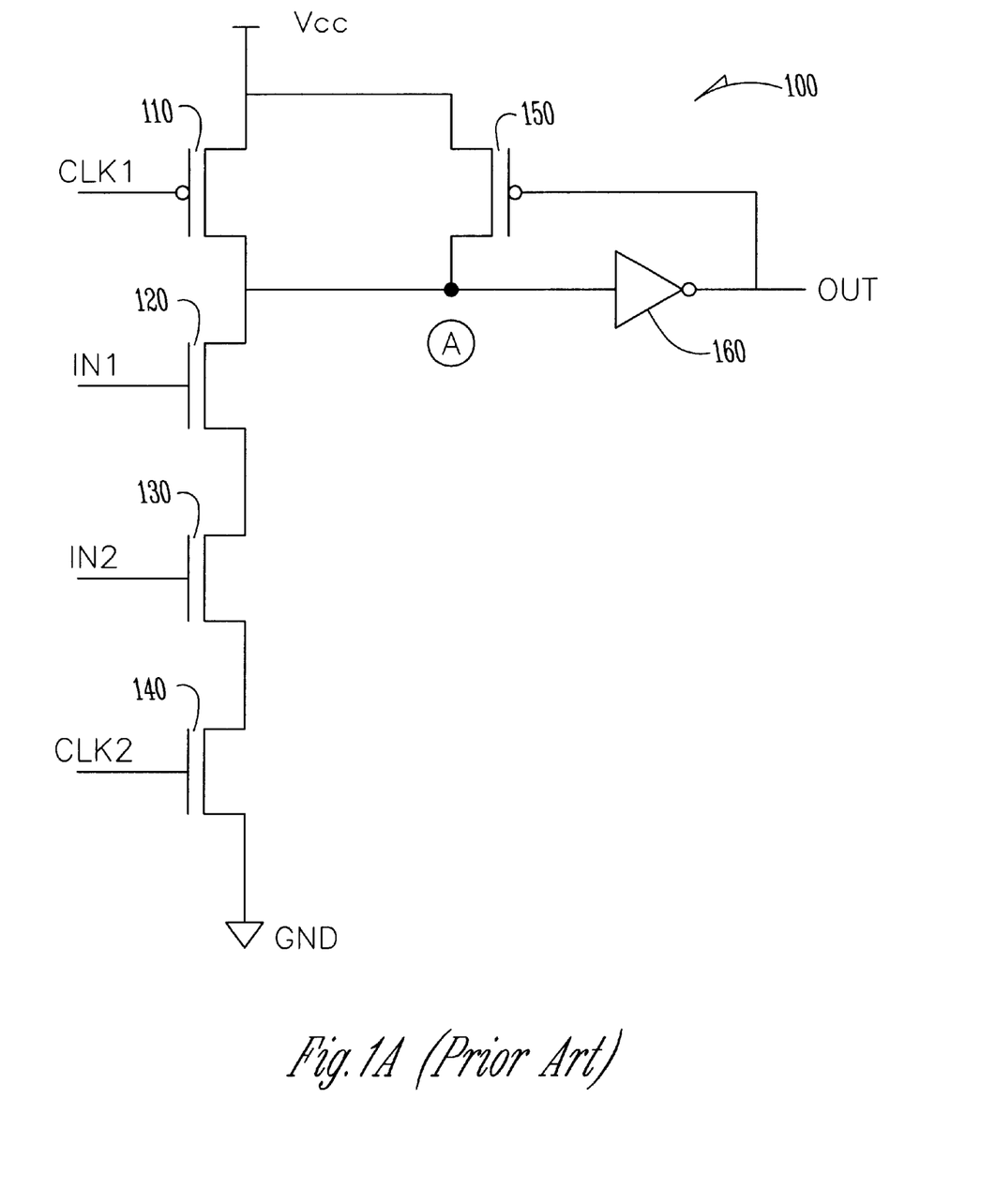
FIG. 1A illustrates a prior art solution for noise, in circuit form, for a domino circuit.

FIG. 1A is a circuit diagram of the prior art illustrating generally, a prior art domino (domino circuits are generally circuits having a dynamic part followed by a static part and an inventor) with keeper circuit 100 comprises, a first transistor 110, a second transistor 120, a third transistor 130, a fourth transistor 140, a fifth transistor 150 and an inverter 160. A first electrode of the first transistor 110 is coupled to $V_{cc}$. A first clock signal (CLK1) is coupled to a control input of the first transistor 110. A first electrode of the fifth transistor 150 is coupled to $V_{cc}$. A second electrode of fifth transistor 150 and a second electrode of the first transistor 1 10 are coupled to an input of inverter 160. A first electrode of the second transistor 120 is coupled to the second electrode of first transistor 110. A control input of the second transistor 120 is connected to an input signal (IN1). A first electrode of third transistor 130 is connected to a second electrode of the second transistor 120. A control electrode of third transistor 130 is connected an input signal (IN2). A first electrode of fourth transistor 140 is connected to a second electrode of the third transistor 130. A control electrode of the fourth transistor 140 is connected to a second clock signal (CLK2). A second electrode of the fourth transistor 140 is connected to V Ground (GND). In some embodiments, the fourth transistor (generally known as foot transistor) may not be needed, when one of the inputs IN1 and IN2 is connected to another dynamic circuit such as the domino circuit.

In this prior art domino with keeper circuit 100, a node labeled 'A' is precharged to a logic high value during a first phase of a clock signal. As the clock signal goes to a logic low level, transistor 110 begins conducting and precharges the node 'A' to a predetermined voltage value. For example, after a next rising edge of the clock signal, and when one of the input signals IN1 and IN2 is high (when one of the inputs IN1 and IN2 is high, the clock input CLK2 will also be high during the evaluation phase), and the other the input signals IN1 and IN2 is low, and a noise is introduced in the input signal having the low signal which raises above the threshold voltage of the transistor corresponding to the low signal, the transistor will be enabled, along with the transistor with the high signal to conduct current such that node 'A' is pulled to a low logic level. Generally the threshold voltage is around 15% of a supply voltage, noise introduced in one of the input signals IN1 and IN2 may often exceed the threshold voltage. In this case, the dynamic logic circuit has an increased sensitivity to noise which can result in the logic circuit providing an erroneous output. Newer technologies are using power supplies with lower voltages and, therefore, lower threshold voltages. Also, due to process variations in various manufacturing phases of a circuit, the threshold voltage may, in fact, be even lower than 15% of the supply voltage of the power supply.

Figure 1B:
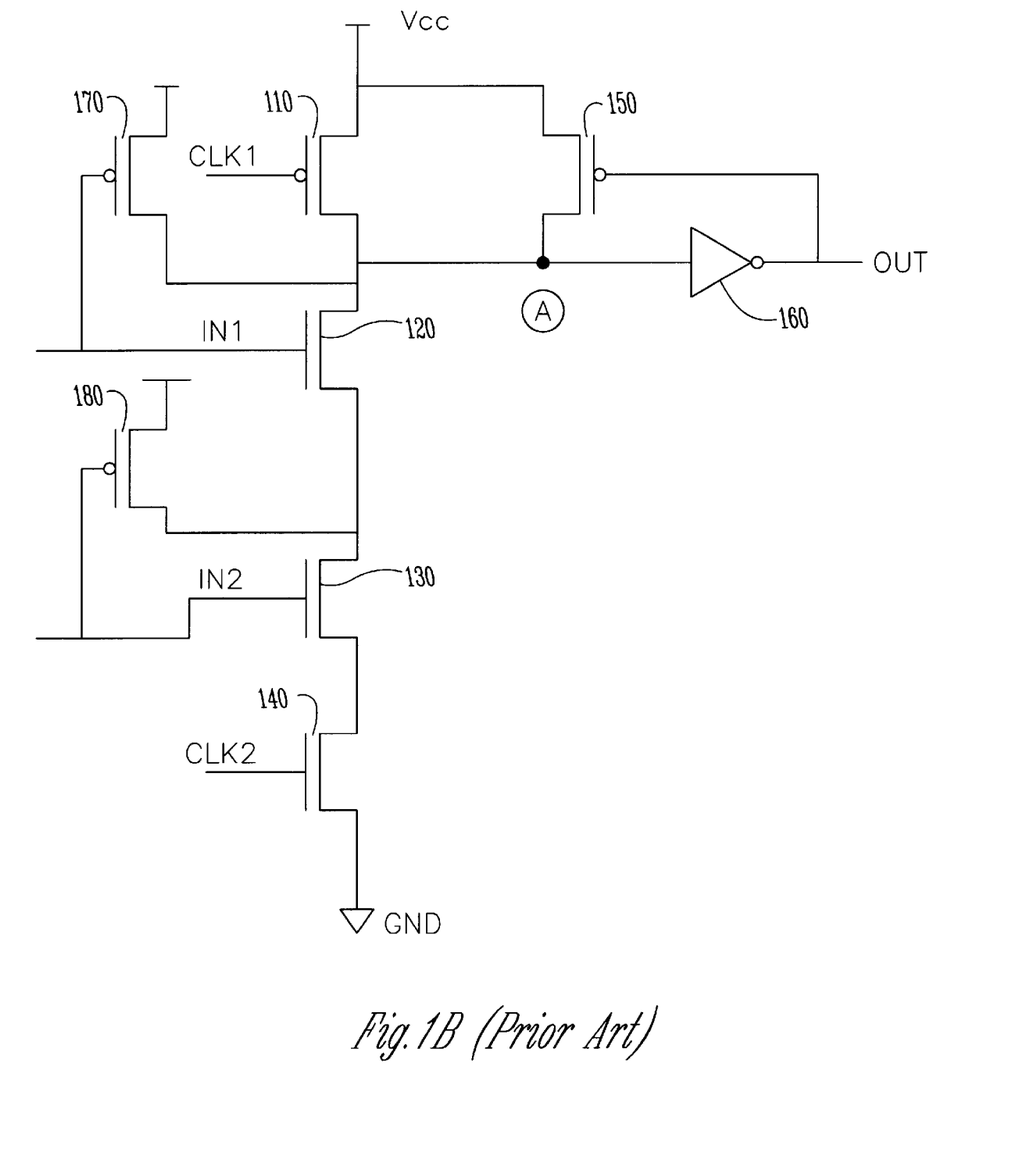
FIG. 1B illustrates a prior art solution for independently selecting noise margins for each input, in circuit form, for the domino circuit.

FIG. 1B is a circuit diagram (AND gate) of the prior art, similar to FIG. 1A, illustrating generally, a prior art solution for independently controlling noise margins for each of the inputs IN1 and IN2. In addition to what is shown in FIG. 1A, FIG. 1B includes a first and second PMOS transistors 170 and 180 coupled to the first and second NMOS transistors 120 and 130, respectively. A node labeled 'A' is precharged to a logic high value during a first phase of a clock signal. As the clock signal goes to a logic low level, transistor 150 begins conducting and precharges the node 'A' to a predetermined voltage value. If, after a next raising edge of the clock signal, and when one of the two input signals IN1 and IN2 is high, and a noise is introduced in the other of the two input signals IN1 and IN2, the output will not be discharged, because when the noise is introduced in the other of the two input signals IN1 and IN2, the current instead of coming from the precharge node A, it comes from the respective PMOS transistors 170 and 180. For example, if after the next raising edge of the clock signal, IN2 is high, and IN1 is low, then the first PMOS transistor 170 is on and the second transistor (NMOS transistor) 120 is off. If we introduce noise in the input IN1, the first PMOS transistor 170 will still be on, the second transistor 120 will turn-on, and the precharge node 'A' will not be discharged, because all of the current passing through the second transistor 120 comes from the $V_{CC}$ through the first PMOS transistor 170. The precharge node 'A' will be discharged, only when the threshold values of both the pull-down and pull-up circuits are crossed Therefore by including the first and second PMOS transistors 170 and 180, respectively in the pull-up network, the node 'A' will be discharged, only after the threshold values of both the pull-down and pull-up circuits are crossed.

Figure 2:
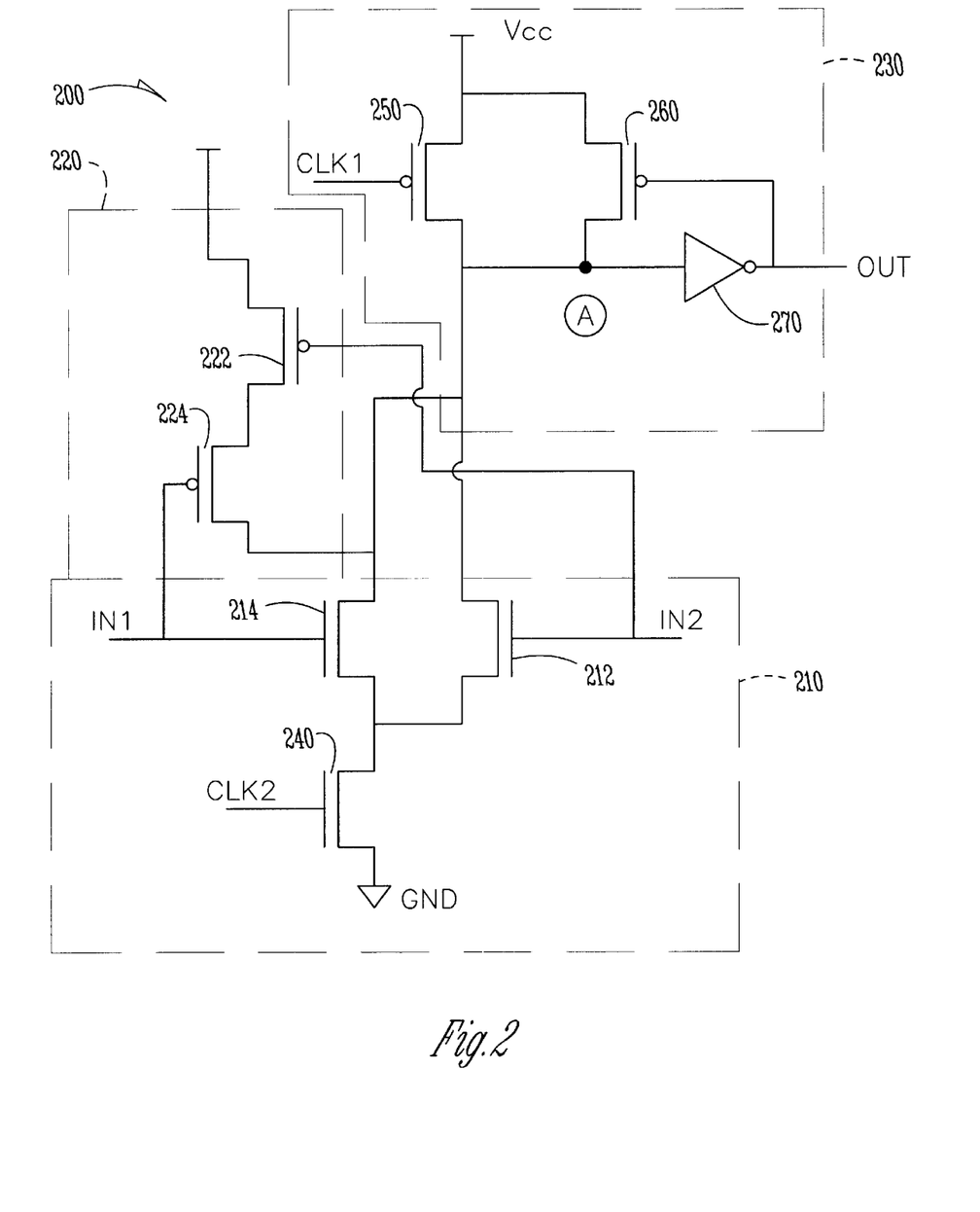
FIG. 2 illustrates solution according to one embodiment of the present subject matter, in circuit form, for an OR gate.

FIG. 2 is a circuit diagram illustrating generally, by way of example, but not by way of limitation, one embodiment of a domino with keeper circuit 200 (OR gate) according to the present invention. The domino with keeper circuit 200 comprises an NMOS circuit 210 having a first NMOS transistor 214 and a second NMOS transistor 212, further comprises a PMOS circuit 220 having a first PMOS transistor 224 and a second PMOS transistor 222 coupled to the first and second NMOS transistors 214 and 212, respectively. The NMOS circuit 210 is further coupled to a first clock transistor 240. The domino with keeper circuit 200 further comprises a precharge circuit 230 having a second clock transistor 250 and a keeper transistor 260 coupled to an inverter 270.

In this domino with keeper circuit 200, a node labeled 'A' is precharged to a logic high value during a first phase of a clock signal. As the clock signal goes to a logic low level, transistor 250 begins conducting and precharges the node 'A' to a predetermined voltage value. If, after a next raising edge of the clock signal, and when both the input signals IN1 and IN2 are low, and a noise is introduced in any one of the input signals IN1 and IN2, the output will not be discharged, because the PMOS circuit (PMOS pull-up stack) is present. The output will be discharged only after the threshold values of the pull-down and pull-up circuits are crossed, i.e., the current sinked by the pull-down becomes larger than the current sourced by the pull-up. For example, if after the next raising of the clock signal, IN1 and IN2 are low, the first and second PMOS transistors 224 and 222 are on, and the first and second NMOS transistors 214 and 212 are off. If we introduce a noise signal in either of the inputs IN1 and IN2, the first and second PMOS transistors 224 and 222 will be still on, then the first and second NMOS transistors 214 and 212 will be turn-on, and the precharge node 'A' will not be discharged, because all of the current passing through either of the first and second NMOS transistors will from the $V_{cc}$ through either one of the first and second PMOS transistors 224 and 222, respectively. The precharge node 'A' will be discharged only when the threshold values of both the pull-down (including NMOS transistors 214 and 212) and pull-up circuits (including PMOS transistors 224 and 222) are crossed.

The noise margin of each input IN1 and IN2 can be individually controlled by changing a ratio of the PMOS transistor to the corresponding NMOS transistor, respectively. In one embodiment the ratio of the PMOS transistor to corresponding NMOS transistor is determined using a simulation technique. The PMOS transistors of the pull-up stack can be omitted for inputs having a noise margin lower than the threshold voltage.

Figure 3:
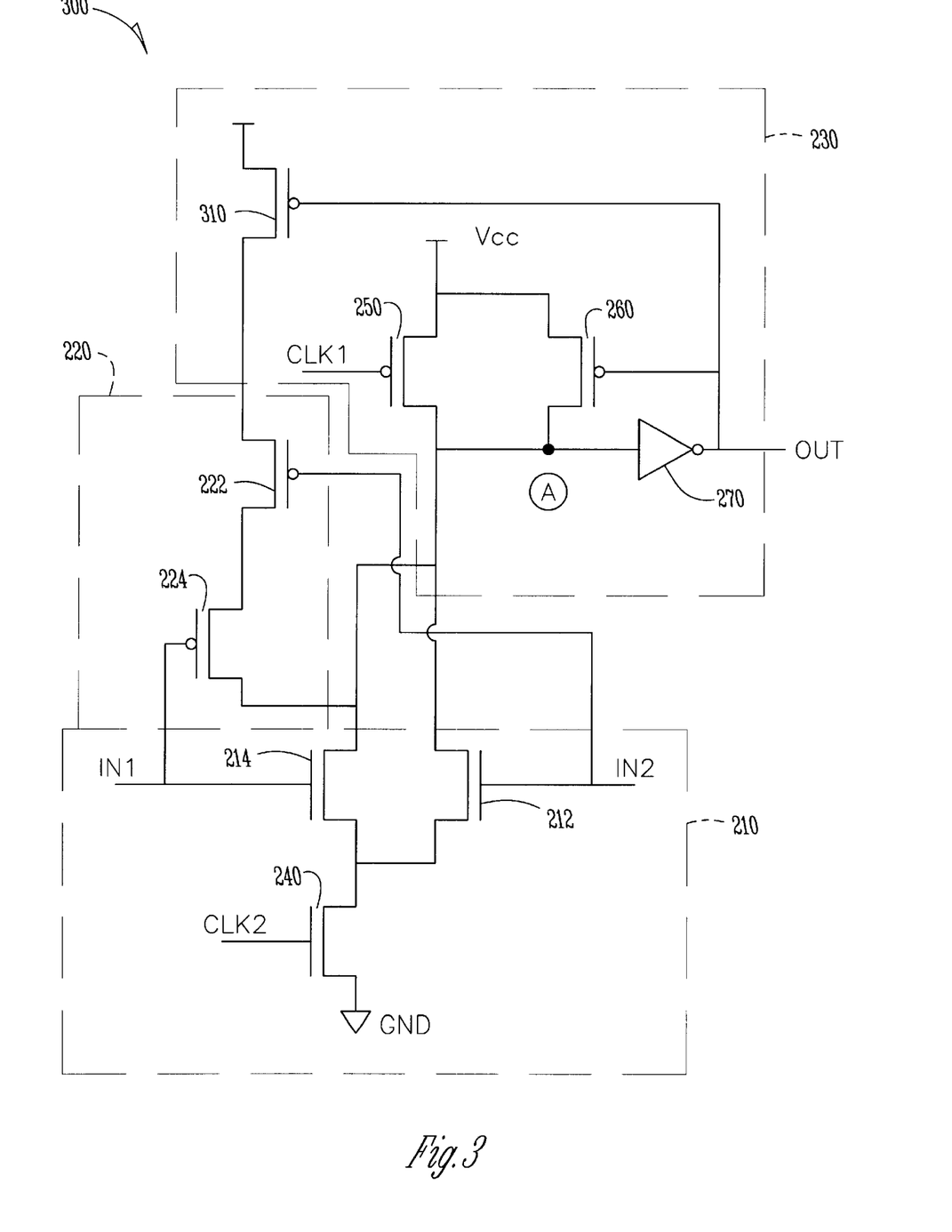
FIG. 3 illustrates solution according to one embodiment of the present subject matter, in circuit form, for an OR gate including a cut-off PMOS transistor.

FIG. 3 is a circuit diagram, similar to FIG. 2, illustrating generally, by way of example, but not by way of limitation, another embodiment of the domino with keeper circuit 300. In addition to what is described in FIG. 2, FIG. 3 includes a cut-off PMOS transistor 310 between the inverter 270 and the second PMOS transistor 222 to turn-off the stack of PMOS transistors 224 and 222 after an evaluation phase, to prevent unintentional activation of the stack of PMOS transistors, when the domino with keeper circuit inputs are not truly dynamic and are not going back to a zero during the evaluation phase.

Figure 4:
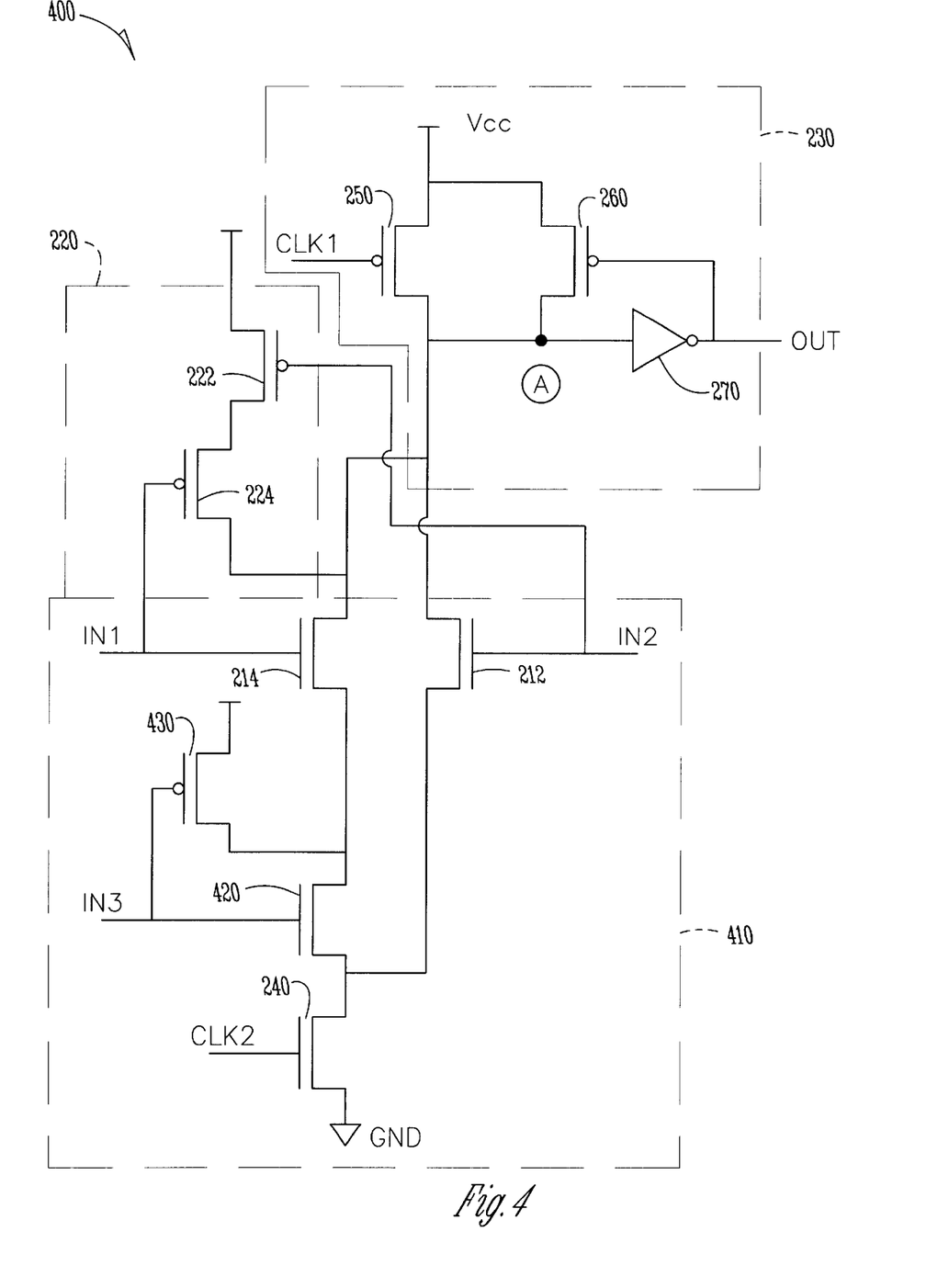
FIG. 4 illustrates solution according to one embodiment of the present subject matter, in circuit form, for an ANDOR gate.

FIG. 4 is a circuit diagram, similar to FIG. 2, illustrating generally, by way of example, but not by way of limitation, one embodiment of an ANDOR gate circuitry 400. In addition to the first and second NMOS transistors 214 and 212 in the NMOS circuit 210 shown in FIG. 2, FIG. 4 further includes a third NMOS transistor 420, and a third PMOS transistor 430 in this embodiment of NMOS circuit 410. A first electrode of the third NMOS transistor 420 is coupled to the second electrode of the first clock transistor 240. A second electrode of the third NMOS transistor 420 is coupled to the first electrode of first NMOS transistor 224. A control electrode of the third NMOS transistor 420 is coupled to an input signal (IN3). A first electrode of the third PMOS transistor 430 is coupled to the second electrode of the third NMOS transistor 420. A second electrode of the third PMOS transistor 430 is coupled to a pull-up circuit. A control electrode of the third PMOS transistor 430 is coupled to the control electrode of the third NMOS transistor 420.

In this ANDOR gate circuit 400, a node labeled 'A' is precharged to a logic high value during a first phase of a clock signal. As the clock signal goes to a logic low level, transistor 250 begins conducting and precharges the node 'A' to a predetermined voltage value. If, after a next raising edge of the clock signal, and when one of the input signals IN1 and IN3 is high, and the other is low, and also the input signal IN2 is low, and a noise is introduced in the input signals having the low signal, the output will not be discharged because the PMOS circuit (PMOS pull-up stack) is present. The output will be discharged only after the threshold values of the pull-down and pull-up circuits are crossed, i.e., the current sinked by the pull-down becomes larger than the current sourced by the pull-up. The noise margin of each input IN1, IN2, and IN3 can be individually controlled by changing a ratio of the PMOS transistor to the corresponding NMOS transistor, respectively. The PMOS transistors of the pull-up stack can be omitted for inputs having a noise margin lower than the threshold voltage.

Figure 5:
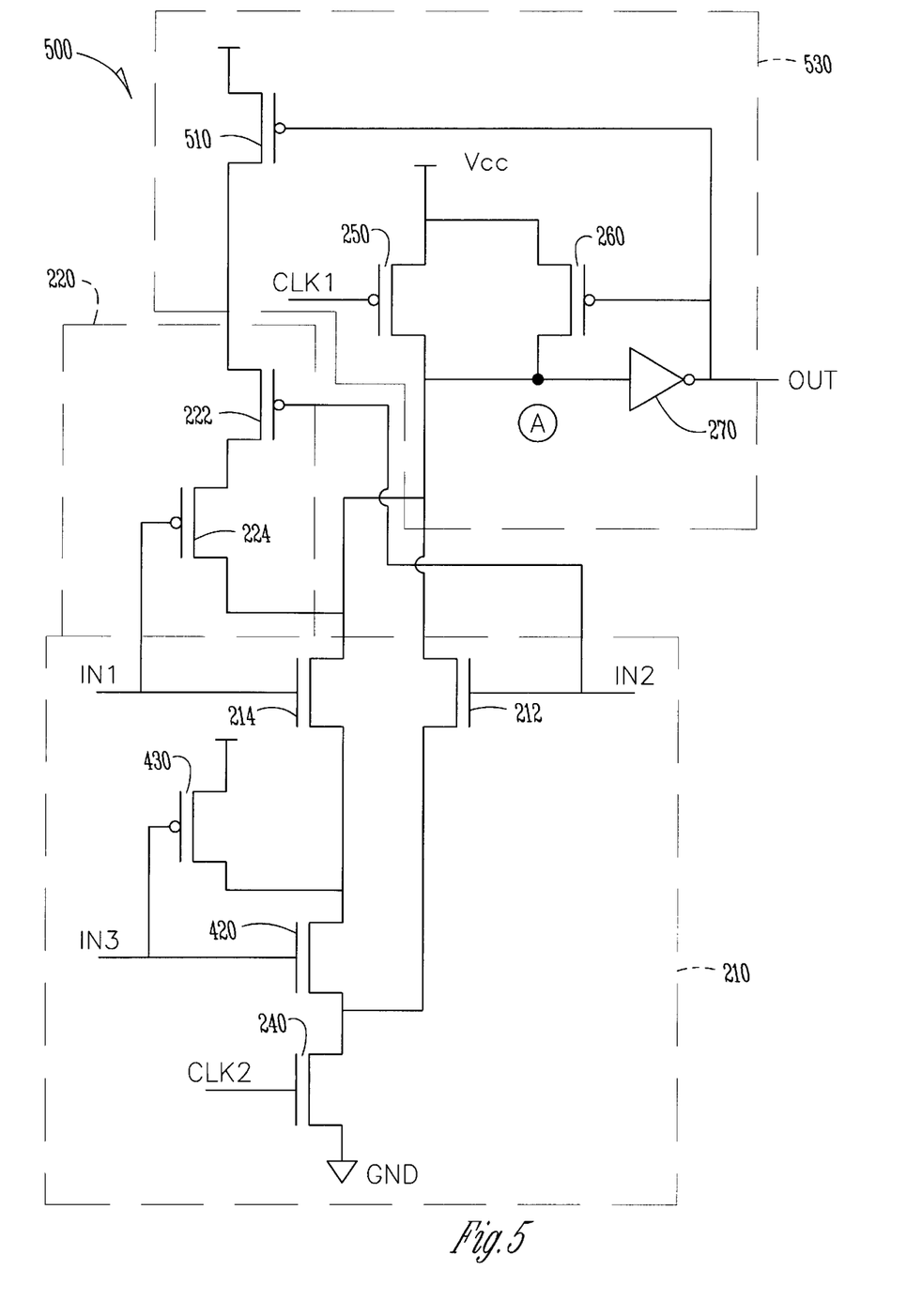
FIG. 5 illustrates solution according to one embodiment of the present subject matter, in circuit form, for an ANDOR gate including a cut-off PMOS transistor.

FIG. 5 is a circuit diagram, similar to FIG. 4, illustrating generally, another embodiment of the ANDOR gate circuitry 500. In addition to what is described in FIG. 2, FIG. 3 includes a cut-off PMOS transistor 510 between the inverter 270 and the second PMOS transistor 222 to turn-off the stack of first, second and third PMOS transistors 224, 222 and 420 after an evaluation phase to prevent an accidental activation of the stack of PMOS transistors when the ANDOR circuit inputs are not truly dynamic and are not going back to a zero during the evaluation phase.

Figure 6:
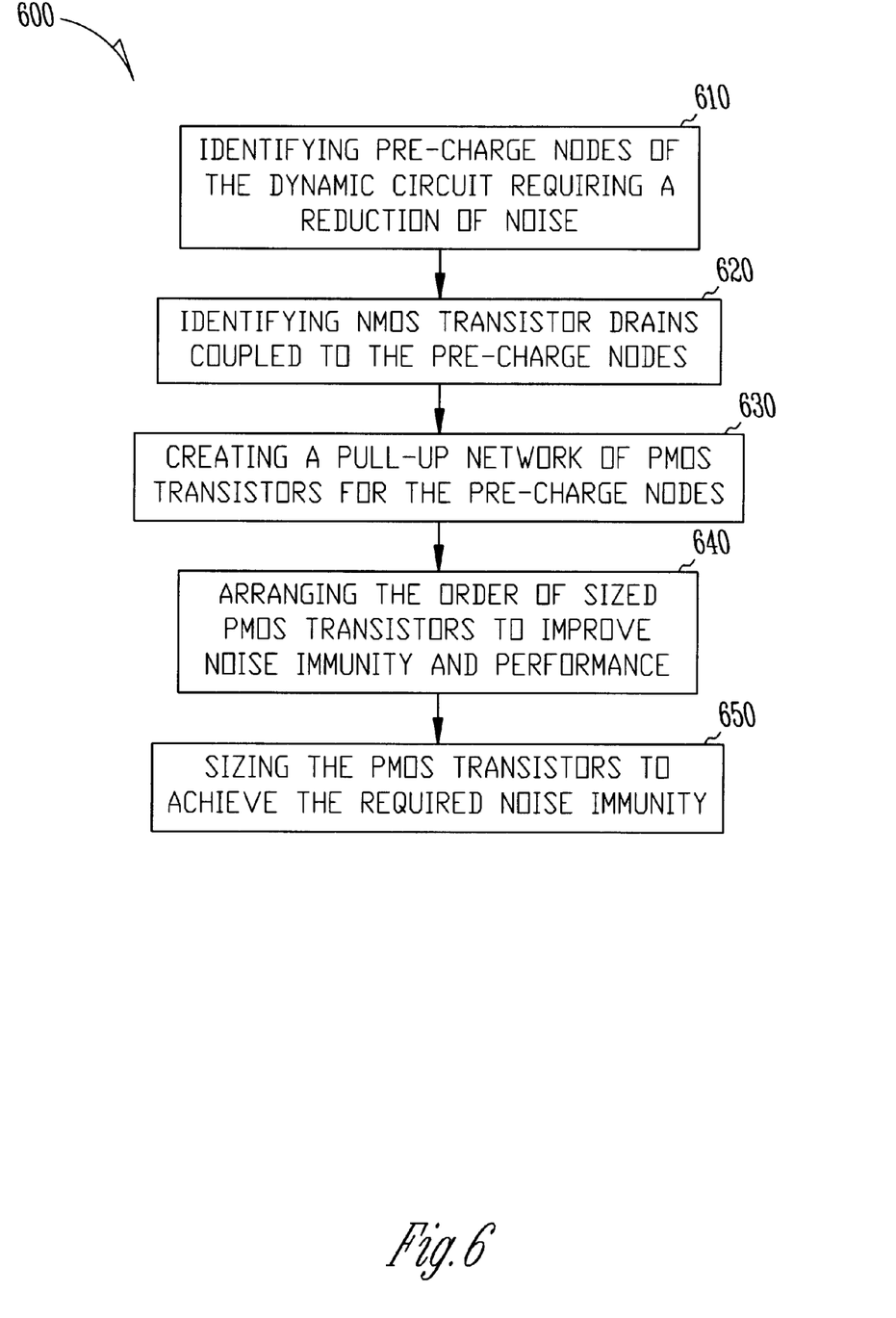
FIG. 6 is a flow diagram of one embodiment of the present invention.

FIG. 6 is a flow diagram, illustrating generally, by way of example, but not by way of limitation, one embodiment of a method of individually adjusting noise immunity of each input of a dynamic circuit including parallel or series-parallel pull-down networks to improve noise immunity and performance of the dynamic circuit 600. The method 600, as shown in FIG. 6 begins with action 610 of identifying precharge nodes of the dynamic circuit requiring a reduction of noise, including any output nodes. In one embodiment, the action of identifying the precharge nodes requiring the reduction of noise is accomplished by using simulation techniques.

Then the next action in the method 600 is to identify NMOS transistor drains connected to the respective identified precharge nodes, excluding any precharge transistors 620.

Then the method 600 requires constructing a pull-up network of transistors for the identified precharge nodes, respectively in action 630. In one embodiment, the pull-up network of transistors is formed of a stack of PMOS transistors such that the gates of the stack of PMOS transistors are connected to the gates of the corresponding NMOS transistor drains, respectively.

Then the next stage in the process 640 includes arranging the order of the PMOS transistors corresponding to the respective precharge nodes to further improve noise immunity and performance of the dynamic circuit. In general the body effect of the dynamic circuit can be used to improve the noise immunity, by arranging the PMOS transistors in the stack such that the ones corresponding to a lower noise margin are placed closer to $V_{cc}$ and the ones corresponding to a higher noise margins are placed closer to the internal node.

Then the next stage in the method 600 includes sizing the PMOS transistors of the pull-up network to achieve a required reduction of noise for the identified precharge nodes, respectively in action 650. Generally, a larger PMOS transistor provides a higher noise immunity but a lower performance, a smaller PMOS transistor provides a lower noise immunity but a higher performance. In one embodiment, the sizing of the PMOS transistors includes using a simulation technique to determine (to fine tune and optimize) the size of the PMOS transistors. In general, there will be some unwanted correlation among the noise margins of the inputs connected to the same stack of PMOS transistors, but this correlation can be determined by simulating the design, and compensating for unwanted correlation by resizing the individual PMOS transistors. The overall increase in noise margins is going to be lower than when no stacks of PMOS transistors are present, because of the larger equivalent "resistance" of stacked PMOS transistors, and because of the body effect on PMOS transistors not connected to the power supply, both of these resulting in a lower pull-up current for a given noise. The size of the PMOS transistors can be increased to improve the noise margins and simulations can be used to fine-tune such sizing of the PMOS transistors.

The above technique can be generally applied to all types of dynamic circuits excepting circuits including pass-transistors for which the role of the source and drain changes depending on the direction of the current flow. The present invention achieves noise immunity by providing a pull-up current to compensate for the pull-down current of a transistor with noisy input. If the noise is larger than the threshold voltage $V_{th}$, the NMOS transistor will turn-on and start discharging the precharging node in the absence of the pull-up stack of PMOS transistors. If the PMOS pull-up stack is present, the output will only be discharged after the switching threshold values of the pull-down and pull-up networks are crossed (the current sinked by the pull-down becomes larger than the current sourced by the pull-up). Using this technique, the noise margin of each individual input of the dynamic circuit can be controlled by changing the ratio of the PMOS transistor to the corresponding NMOS transistor.

In one embodiment, the technique further includes turning-off the stack of series of PMOS transistors after an evaluation phase. Turning-off the stack of series of PMOS transistors is generally necessary when the dynamic circuit inputs are truly dynamic, and that the input voltages do not go back to zero in the evaluation phase (this can activate the pull-up PMOS stack).

Conclusion

The above described dynamic circuit provides, among other things, a method of independently controlling the noise margins of each input of a dynamic circuit to improve noise immunity and performance of the dynamic circuit. This technique enables to achieve the highest possible performance in the dynamic circuit by controlling noise immunity of each input of the dynamic circuit based on the needs of the each input. Also the present invention allows for individual control of the noise margin of each input for most types of dynamic circuits with a small performance penalty.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of individually controlling noise immunity of each input of a dynamic circuit including a parallel pull-down network, comprising:

identifying precharge nodes of the dynamic circuit requiring a reduction of noise;

identifying NMOS transistor drains connected to the identified precharge nodes, respectively;

creating multiple pull-up networks of transistors including a pull-up network for each of the identified precharge nodes, respectively, wherein at least one of the multiple pull-up networks is directly coupled to a power supply voltage node; and arranging the order of the NMOS transistors corresponding to the precharge nodes, respectively to further improve the noise immunity and performance of the dynamic circuit.

2. The method of claim 1, further comprises:

sizing the arranged transistors of the created pull-up network of transistors to obtain a required reduction of noise for the precharge nodes, respectively.

3. The method of claim 2, wherein the sizing of the PMOS transistors comprises using a simulation technique to determine the size of the PMOS transistors.

4. The method of claim 1, wherein the identifying the precharge nodes comprises using a simulation technique to identify the precharge nodes in the dynamic circuit requiring a reduction of noise.

5. The method of claim 1, wherein the creating the pull-up network of transistors comprises creating a stack of series of PMOS transistors such that gates of the stack of PMOS transistors are connected to gates of corresponding NMOS transistor drains, respectively.

6. The method of claim 1, wherein the arranging the order of the PMOS transistors comprises arranging the PMOS transistors in the stack such that the precharge nodes requiring a lower noise margin are placed closer to $V_{cc}$, and the precharge nodes requiring a higher noise margin are placed closer to the precharge nodes, respectively.

7. The method of claim 1, further comprises:

turning-off the stack of series of PMOS transistors after an evaluation phase.

8. A method of individually adjusting noise immunity of each input of a dynamic CMOS circuit including a series-parallel pull-down network, comprising:

identifying precharge nodes of the dynamic circuit requiring a reduction of noise;

identifying NMOS transistor drains connected to the identified precharge nodes, respectively;

constructing multiple pull-up networks of transistors including a pull-up network for each of the identified precharge nodes, respectively, wherein at least one of the multiple pull-up networks is coupled directly to a power supply voltage node; and arranging the order of the transistors corresponding to the precharge nodes, respectively to further improve the noise immunity and performance of the dynamic CMOS circuit.

9. The method of claim 8, further comprises:

sizing the transistors of the constructed pull-up network to achieve a required reduction of noise for the precharge nodes, respectively.

10. The method of claim 9, wherein the sizing of the transistors comprises using a simulation technique to size the transistors of the constructed pull-up network to achieve the required reduction of noise for the precharge nodes, respectively.

11. The method of claim 8, wherein the constructing the pull-up network of transistors comprises constructing a stack of series of PMOS transistors such that gates of the stack of PMOS transistors are connected to gates of corresponding NMOS transistor drains, respectively.

12. The method of claim 11, wherein the arranging the order of PMOS transistors comprises arranging the PMOS transistors in the stack such that the precharge nodes requiring a lower noise margin are placed closer to $V_{cc}$, and the precharge nodes requiring a higher noise margin are placed closer to the precharge nodes, respectively.

13. The method of claim 11, further comprises:

turning-off the stack of series of PMOS transistors after an evaluation phase to prevent accidental activation of the stack of PMOS transistors.

14. The method of claim 8, wherein constructing the multiple pull-up networks of transistors including a pull-up network for each of the identified precharge nodes comprises:

connecting at least one of the multiple pull-up networks to a power supply voltage node through a PMOS transistor.

15. A method, comprising:

coupling a first clock transistor between a power supply voltage node and a precharge node;

coupling first, second, and third NMOS transistors between the precharge node and the first clock transistor;

coupling a second clock transistor between the first, second, and third NMOS transistors and a ground node;

coupling first and second PMOS transistors between the precharge node and the power supply voltage node; and coupling a third PMOS transistor between the power supply voltage node and the first, second, and third NMOS transistors.

16. The method of claim 15, further comprising:

coupling control electrodes of the first, second, and third PMOS transistors to associated input signal nodes of the first, second, and third NMOS transistors.

17. The method of claim 15, further comprising:

coupling a fourth PMOS transistor between the power supply voltage node and the second PMOS transistor.

18. The method of claim 17, further comprising:

coupling an inverter to the precharge node;

coupling a keeper transistor between the precharge node and the power supply voltage node; and coupling a control electrode of the keeper transistor to an output of the inverter.

19. The method of claim 18, further comprising:

coupling a control electrode of the fourth PMOS transistor to the control electrode of the keeper transistor and the output of the inverter.

20. The method of claim 18, wherein the keeper transistor is a PMOS transistor.

* * * * *